US008887112B2

(12) United States Patent
Tzoref-Brill et al.

(10) Patent No.: US 8,887,112 B2
(45) Date of Patent: Nov. 11, 2014

(54) TEST VALIDATION PLANNING

(71) Applicant: International Business Machines Corporation, Armonk, NY (US)

(72) Inventors: Rachel Tzoref-Brill, Haifa (IL); Itai Segall, Tel Aviv (IL); Aviad Zlotnick, Mitzpeh Netofah (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/676,110

(22) Filed: Nov. 14, 2012

(65) Prior Publication Data

US 2014/0137057 A1    May 15, 2014

(51) Int. Cl.
*G06F 9/455* (2006.01)
*G06F 17/50* (2006.01)

(52) U.S. Cl.
CPC .................................. *G06F 17/5045* (2013.01)
USPC ............ 716/106; 716/107; 716/111; 716/136

(58) Field of Classification Search
CPC .............. G06F 11/263; G06F 11/3684; G06F 11/3688; G06F 11/3664; G06F 11/3672; G06F 11/3692; G06F 11/36; G06F 11/3604; G06F 11/3608; G06F 11/3676; G01R 31/31704
USPC ......................................... 716/106–112, 136
See application file for complete search history.

(56) References Cited

U.S. PATENT DOCUMENTS

| 2008/0172652 | A1 | 7/2008 | Davia et al. | |
| 2008/0216053 | A1* | 9/2008 | Sluiman et al. | 717/124 |
| 2009/0204591 | A1* | 8/2009 | Kaksonen | 707/3 |
| 2010/0050020 | A1* | 2/2010 | Weatherhead | 714/38 |
| 2010/0287534 | A1 | 11/2010 | Vangala et al. | |
| 2011/0289488 | A1 | 11/2011 | Ghosh | |

OTHER PUBLICATIONS

"PWiseGen: Generation Test Cases for Pairwise Testing", by Pedro Flores, Yoonsik Cheon, CSAE @Jun. 12, 2011.*

* cited by examiner

*Primary Examiner* — Nha Nguyen
(74) *Attorney, Agent, or Firm* — Ziv Glazberg

(57) ABSTRACT

A computer-implemented method, computerized apparatus, and computer program product for test validation planning. The computer-implemented method, performed by a processor, comprising: having a test validation activity to be performed to validate results of two or more tests of a test suite; and automatically determining, by a processor, a subset of the two or more tests for which to perform the test validation activity; whereby avoiding performing duplicate validation activities. Optionally, for each test of the test suite a valuation of a set of functional attributes is available, and a subset of the functional attributes is deemed as relevant functional attributes with respect to the test validation activity. In such an embodiment, said determining is based on the valuation of the relevant functional attributes.

12 Claims, 2 Drawing Sheets

TEST VALIDATION PLANNING

TECHNICAL FIELD

The present disclosure relates to testing in general, and to test planning, in particular.

BACKGROUND

Omissions are a major risk in testing. Test planning techniques are a well known way to improve the quality of testing by reducing both omissions and redundancy. These techniques try to prevent omissions in advance (i.e., before tests are implemented and executed) by selecting what to test out of a possibly enormous test space, in a way that reduces as much as possible the risk of bugs escaping to the field. The selection of tests is also characterized in avoiding or reducing tests that are similar to one another and provide no added value. In some cases, three tests may have the same coverage as two tests, as the third test may overlap both two tests (e.g., a first part overlaps the first test and the rest of the test overlaps the second test).

One such known technique is Combinatorial Test Design (CTD). CTD is based on a modeling of the test space. The test space can represent inputs, scenarios, configurations, the application's internal state, or any other aspect that one is interested in testing. The model comprises a set of functional attributes, respective domains of values for each attribute, and restrictions on the value combinations. The restrictions may be Boolean expressions defining when value combinations are valid or invalid. Restrictions may be represented in other manners as well, such as by explicitly enumerating all valid or all restricted combinations of values. The set of valid value combinations, i.e. all combinations from the Cartesian product of the values that pass the restrictions, define the space to be tested.

In CTD, a target level of interaction between sets of attributes may be defined. For example, a level two interaction of all attributes may require that for each two attributes, all combinations of their possible value be checked. A three level interaction would require that for each three attributes, all combinations of their possible values be checked. In some exemplary embodiments, the CTD may define several sets of attributes and interaction levels in them.

Based on the CTD, a description of the test plan may be determined. The description may comprise coverage tasks, each having a value assigned to each functional attribute, and representing a different test to be performed. The description may provide for a coverage as defined (e.g., two level interactions of all attributes). The total number of coverage tasks may be significantly smaller than the total number of possible coverage tasks in accordance with the test space. Some coverage tasks (i.e., tests) may overlap in values of some of their functional attributes.

BRIEF SUMMARY

One exemplary embodiment of the disclosed subject matter is a computer-implemented method, the method performed by a processor, the method comprising: having a test validation activity to be performed to validate results of two or more tests of a test suite; and the processor automatically determining a subset of the two or more tests for which to perform the test validation activity; whereby avoiding performing duplicate validation activities.

In some exemplary embodiments, for each test of the test suite a valuation of a set of functional attributes is available, wherein a subset of the functional attributes is deemed as relevant functional attributes with respect to the test validation activity; and wherein said determining is based on the valuation of the relevant functional attributes.

Another exemplary embodiment of the disclosed subject matter is a computerized apparatus having a processor, the processor being adapted to perform the steps of: having a test validation activity to be performed to validate results of two or more tests of a test suite; and the processor automatically determining a subset of the two or more tests for which to perform the test validation activity; whereby avoiding performing duplicate validation activities.

Yet another exemplary embodiment of the disclosed subject matter is a computer program product comprising a non-transitory computer readable medium retaining program instructions, which instructions when read by a processor, cause the processor to perform a method comprising: having a test validation activity to be performed to validate results of two or more tests of a test suite; and automatically determining a subset of the two or more tests for which to perform the test validation activity; whereby avoiding performing duplicate validation activities.

BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

Figure 1:
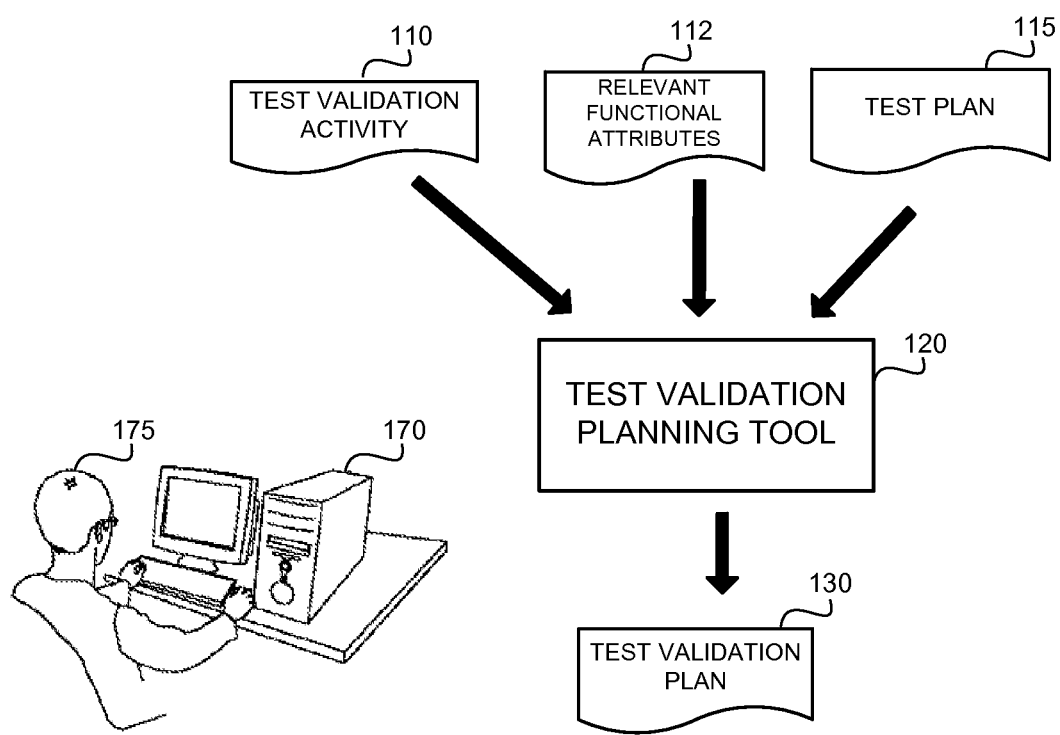
FIG. 1 shows a schematic illustration of a computerized environment, in accordance with some embodiments of the disclosed subject matter.

The disclosed subject matter is described below with reference to flowchart illustrations and/or block diagrams of methods, apparatus (systems) and computer program products according to embodiments of the subject matter. It will be understood that some blocks of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

In the present disclosure a "validation activity" is a post-test execution activity in which the results of the execution is determined. Validation activity may be manual, semi automatic or automatic. In some exemplary embodiments, validation activity may include checking that the results of execution are as expected. In some exemplary embodiments, the test may comprise expected results of execution of the test or similar information. In some exemplary embodiments, the test may comprise a step explaining the validation activity to be performed to check if the test was successful.

In the present disclosure, a "functional attribute" is an attribute of a test representing any functional aspect of the test. The functional attribute may be associated with a domain. All functional attributes may together define a functional test space, which is the Cartesian product of the functional attributes' possible values (optionally having a subset of combination excluded due to being defined as restricted or illegal. The functional attribute may be a functional attribute of a functional coverage model.

In the present disclosure, a "relevant functional attribute" with respect to a validation activity, is a functional attribute which value may influence a result of the test that is being checked by the validation activity.

As an example only, functional attribute of "DB ACTION" may be a relevant functional attribute for a validation activity of "Check DB state" but may not be a relevant functional attribute for a validation activity of "Check File in Memory".

In the present disclosure, a "distinct validation activity" is a validation activity to be performed in response to a test, that is not redundant with respect to other validation activities performed in response to other tests. As an example, if the relevant functional attribute of a validation activity "Check DB" is "DB ACTION" functional attribute, than "Check DB" with respect to a first test which exhibits "DB ACTION"=DELETE is a distinct validation activity with respect to "Check DB" validation activity with respect to a second test which exhibits "DB ACTION"=INSERT. but is not distinct with respect to "Check DB" validation activity that is performed with respect to another test exhibiting "DB ACTION"=DELETE. In some exemplary embodiments, a distinct validation activity is an activity which if not performed an aspect of the test suite which could have been validated would not be validated.

In the present disclosure, a "duplicate validation activity" is a validation activity that is not distinct. A duplicate validation activity may be avoided without having a negative impact on the validation of the test suite. Performing duplicate validation activity may be deemed as a waste of resources.

After a test is executed, a validation activity may be performed to check if the test was successful or if a bug is observed.

A test, such as but not limited to a test script, may have instructions for setting up a system and for executing commands on it. In some cases, the test may include instructions for performing the validation activity or for explaining the validation activity to be performed manually or semi automatically. In some test suites, even those that are created by CTD, there are combinations of attribute values that repeat in more than one test. If a validation activity depends on such a combination, performing it more than once may be a waste of resources.

As an example consider the following case: in an online shopping system, one wants to validate that the inventory is updated when a purchase is made. Updating the inventory depends on whether the purchased item is in stock or not, and on whether online payment was approved or not. There are four combinations of these two attributes. If there are other variables in the system under test, there may be many more tests, but one may not like to validate the inventory operations more than four times.

One technical problem dealt with by the disclosed subject matter is to allow for planning of validation activities associated with a test plan. Test validation planning may take into account that certain validation aspects of two tests may overlap. In some exemplary embodiments, test validation planning may provide a way to avoid duplicate validation activities.

One technical solution is to define for each validation activity of the tests functional attributes that influence the results (also referred to as relevant functional attributes). A validation activity may be avoided when the same values for the relevant functional attributes are seen in two or more tests. The validation activity may be performed once instead of a plurality of times. In some exemplary embodiments, the validation activity may be performed several times but less than the number of tests having the same valuation of the relevant functional attributes.

In some exemplary embodiments, a tool may prompt the user to input which validation activities are performed. For each validation activity the user may be prompted to input which functional attributes are believed to influence the validated result. The tool may process a description of a test suite, and output a list of necessary validations with their alternatives. For example, consider a validation activity which is based on the values of two attributes A, B out of many attributes. A report indicating that the validation activity is required to be performed only three times may be provided, although there dozens of tests. Additionally, for example, the report may indicate one or more alternative tests for which the validation activity is deemed as equivalent. As another example, the report may indicate the value of the relevant attributes. In such an example, a report may be:

Record Delete:
   A=3, B=2->Tests 1, 17, or 23
   A=0, B=0->Test 3
   A=17, B=17->Tests 2, 4, 5, 18, or 35

The report indicates that for the validation activity "Record Delete", the activity is required three times. Once for either of tests 1, 17 and 23 which are considered equivalent for the purpose of this validation activity as the values of A and B are the same in all of them (i.e., A=3, B=2); once for test 3 which is the only test exhibiting A=0, B=0; and once for either tests 2, 4, 5, 18 and 35 which are considered equivalent as all of them exhibit A=17 and B=17.

The report can reduce unnecessary work that results from duplicate validation activities.

In some exemplary embodiments, the test validation activities may be performed automatically or partially automatically, and an appropriate validation script may be automatically generated to be executed in response to execution of the tests.

Another technical solution is to reduce a total amount of resources used for the validation activity. The reduction may be achieved by identifying, either manually or in an automatic manner, validation activities that, when performed together, require less resources than when performed separately. In particular, this can happen when one validation is a subset of the other, when both validation activities have common initialization activities, or the like.

As an example, consider that ACTIVITY1 and ACTIVITY2 are determined to be optimized when performed together. ACTIVITY1 depends on attributes A and B and ACTIVITY2 depends on attributes B and C. Consider the following report:

ACTIVITY1:
   A=0, B=0->Tests 1, 2, 3
   A=5, B=0->Tests 6, 9
ACTIVITY2
   B=0, C=2->Tests 1, 6, 9
   B=0, C=5->Tests 2, 3

The report may indicate that it is preferable to perform ACTIVITY1 and ACTIVITY2 together on test 6 (accounting for A=5, B=0 and B=0, C=2), together on test 2 (accounting for A=0, B=0 and B=0, C=5). In such a manner, the resources utilized in performing the validation activities may be reduced in comparison to performing ACTIVITY1 on tests 1 and 6 and ACTIVITY2 on tests 9 and 2.

In some exemplary embodiments, an optimization algorithm, such as but not limited to simulated annealing, Direct Monte-Carlo sampling, Inner approximation, or the like, may be used to automatically determine an optimized set of validation activities given the test suite and associated costs of performing each validation activity, alone or in combination with other validation activities.

In some exemplary embodiments, a user interface, such as a Graphical User Interface (GUI) or an interactive interface, may be provided to allow the user to define which validation activities will be performed with which tests. The user may then be provided with an initial suggestion, such as based on a minimal cost calculation, and may override it or otherwise change it. In some exemplary embodiments, by allowing the user to see the report, the user may identify mistakes which may be based on the definition of the attributes that are relevant for each validation activity.

In some exemplary embodiments, equivalent classes may be provided by the user for set of valuation to the functional attributes which are considered equivalent for the purposes of the validation activity. In some exemplary embodiments, the user could give a set of attributes, and the tool would display their Cartesian product (or a subset of the combinations that appear in the test suite). The user can then mark "equivalence classes", such as for example indicating that one of the alternative combinations A=1, B=3 or A=2, B=4, or A=2, B=8 is sufficient for validation, hence reducing the amount of validation activities required even further.

In some cases, some attributes may be identified interchangeable, such as symmetric attributes. Based on such definitions, the number of validation activities may be further reduced.

In some exemplary embodiments, the disclosed subject matter may be incorporated in a CTD tool, such as IBM FoCuS™. Duplication of validity efforts may be an inhibitor of using a CTD tool, and the disclosed subject matter may have the effect of reducing such duplication and therefore encouraging users to use CTD tools.

In some exemplary embodiments, functional attributes are inputs that are controllable by the designer of the test. In some exemplary embodiments, the functional model used to describe the tests may be an input-output model in which some of the functional attributes are inputs while others are outputs. The value of an output functional attribute may be dependent on values of one or more input functional attributes. In such a input-output model, a restriction excluding combination of values from the test-space may be used to automatically determine the relevant functional attributes. For example, dependencies of output functional attribute one some input functional attributes may be identified (e.g., when a value of an input functional attribute changes, the value of the output functional attribute may change due to a restriction). For each concrete output value, the user may be notified whether or not the output value needs to be verified or if such a check would be duplicate validation activity in view of other checks to be performed with respect to another test having the same concrete output value and concrete input value for the input functional attributes which the output attribute depends on. In some exemplary embodiments, such a determination may be performed using a Binary Decision Diagram (BDD) representing the set of restricted coverage tasks, representing the test space, or the like.

Referring now to FIG. 1, showing a schematic illustration of a computerized environment, in accordance with some embodiments of the disclosed subject matter.

In some exemplary embodiments, a User 175, such as a developer, a QA staff member, a tester, a designer, a verification engineer or the like, may interact with Computerized Environment 100. User 175 may utilize a Man-Machine Interface (MMI) 170 such as a terminal, a display, a keyboard, an input device or the like to interact with a computer (not shown).

A Test Validation Planning Tool 120 may be configured to generate a test validation plan 130. In some exemplary embodiments, User 175 may override some of the suggest validation plan using a user interface of Tool 120. User 175 may decide to perform some duplicative validation activities. User 175 may decide to perform a different validation activity in the same equivalent class than a validation activity suggested by Tool 120.

In some exemplary embodiments, Tool 120 may receive as input, e.g. from an electronic source, from User 175, or from another source, Test Validation Activity 110 to be performed with respect to a test suite described in a Test Plan 115. Relevant Functional Attributes 112 with respect to Test Validation Activity 110 may be provided.

Additionally or alternatively, User 175 may be prompted to indicate a validation activity to be performed with respect to tests of Test Plan 115. For each such activity, User 175 may manually provide or Tool 120 may automatically infer from a functional model (not shown) Relevant Functional Attributes 112.

Tool 120 may be configured to identify unique combinations of values for Relevant Functional Attributes 112 with respect to tests that are to be validated by Test Validation Activity 110. For each such unique combination of values Tool 120 may select one test for which to perform Test Validation Activity 110 thereby avoiding performing duplicate validation activities. In some exemplary embodiments, an equivalent class of tests may be defined that is not based solely on unique combination values, such as one of alternative combinations of values to Relevant Functional Attributes 110, unique combination of values to Relevant Functional Attributes 110 taking into account interchangeable attributes, or the like.

It will be noted that Test Validation Activity 110 may be in some embodiments a descriptive depiction of the validation activity to be performed. Additionally or alternatively, Test Validation Activity 110 may be indicated in Test Plan 115 with respect one or more tests for which the validation activity is to be performed. Additionally or alternatively, Test Validation Activity 110 may be a script performing the validation activity itself or making preparations for a manual validation. In some exemplary embodiments, Test Validation Plan 130 may include a script to execute tests of Test Plan 115 and in response to such execution, performing validation activities associated with the test and based on the determinations by Tool 120 and/or User 175.

Figure 2:
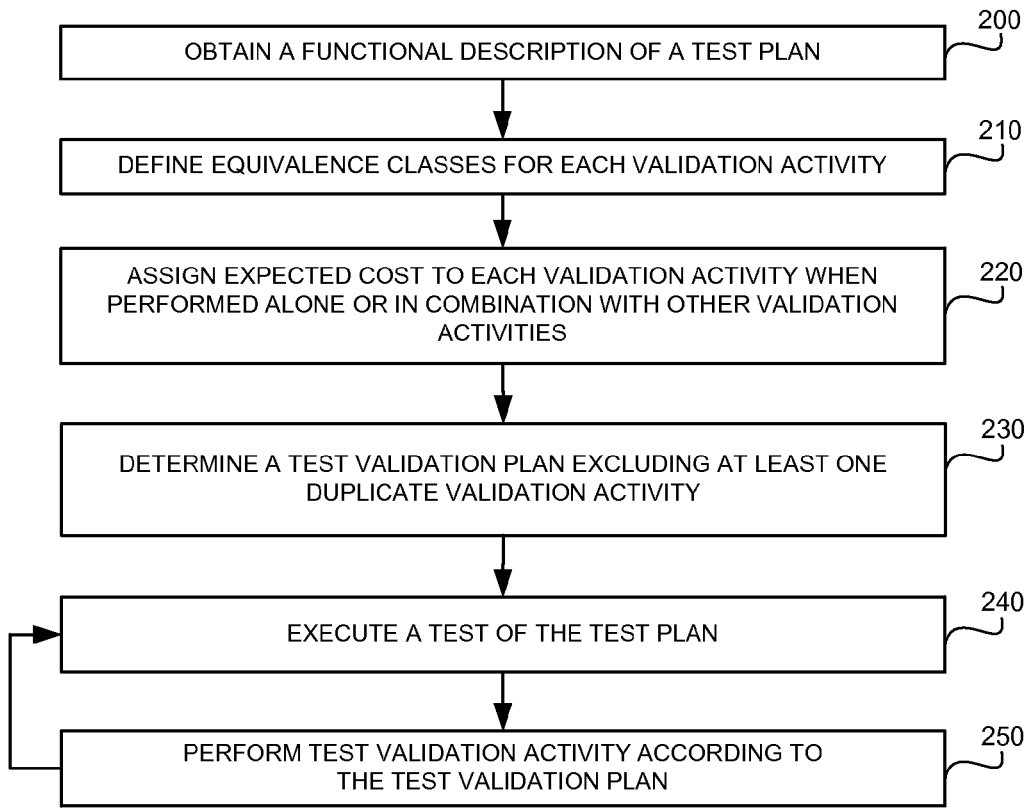
FIG. 2 shows a flowchart of a methods, in accordance with some embodiments of the disclosed subject matter.

Referring now to FIG. 2 showing a flowchart of a method, in accordance with some embodiments of the disclosed subject matter.

In Step 200, a functional description of a test plan may be obtained. The functional description may be, for example, a functional coverage model and an indication of coverage tasks covered by the test plan, a test plan generated by a CTD tool, or the like.

In Step 210, equivalence classes for each validation activity associated with the test plan may be defined. The equivalence class may be defined based on unique valuation of relevant functional attributes, based on manual definition of equivalence between two or more combinations of valuations of relevant functional attributes, or the like. In some exemplary embodiments, an equivalence class may be defined taking into account interchangeable attributes which may be manually identified or automatically inferred from a functional description of the test-space in which symmetry may be exhibited with respect to the interchangeable attributes.

In Step 220, an expected cost may be assigned to each validation activity. The expected cost may refer to resource utilization, such as time consumption, manual labor, or any other resource needed for performing the validation activity. In some exemplary embodiments, different costs may be assigned when several validation activities are performed together.

In Step 230, a test validation plan may be determined, such as by Tool 120. The test validation plan may exclude at least one duplicate validation activity that could have been performed with respect to the test plan.

In some exemplary embodiments, the test validation plan may be determined in such a manner that yields a minimal cost, such as by indicating to perform two or more test validation activities for which the combined cost is deemed lower than a combination of their two separate costs.

In Step 240, a test of the test plan may be executed. The test may be executed manually, automatically, or in a semi-automatic manner.

In Step 250, one or more test validation activities may be performed with respect to the test and according to the test plan. In some exemplary embodiments, the test validation activities may be performed manually, automatically, or in a semi-automatic manner.

In some exemplary embodiments, Steps 240-250 may be performed iteratively with respect to different tests. In some exemplary embodiments, the iterative process may be performed until the entire test plan is executed and the test validation plan is performed.

Figure 3:
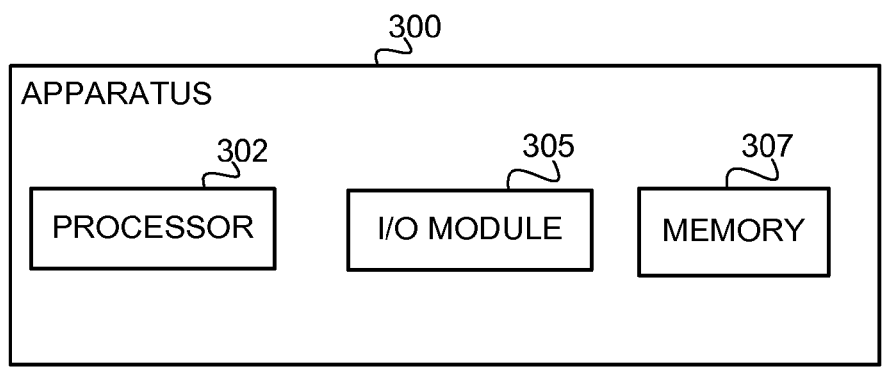
FIG. 3 shows a block diagram of components of an apparatus, in accordance with some exemplary embodiments of the disclosed subject matter.

Referring now to FIG. 3 showing a block diagram of components of an apparatus, in accordance with some exemplary embodiments of the disclosed subject matter.

An Apparatus 300, such as Tool 120, may be configured generate a test validation plan.

In some exemplary embodiments, an Apparatus 300 may comprise a Processor 302. Processor 302 may be a Central Processing Unit (CPU), a microprocessor, an electronic circuit, an Integrated Circuit (IC) or the like. Processor 302 may be utilized to perform computations required by Apparatus 300 or any of it subcomponents. Processor 302 may be configured to execute computer-programs useful in performing the method of FIG. 2.

In some exemplary embodiments of the disclosed subject matter, Apparatus 300 may comprise an Input/Output (I/O) Module 305. I/O Module 305 may be utilized to provide an output to and receive input from a user. However, it will be understood the Apparatus 300 may be utilized without user intervention. In some exemplary embodiments, I/O Module 305 may be utilized to obtain, such as from a digital source, from a user, or the like, a functional model, a test plan, relevant functional attributes to a test validation activity, or the like. In some exemplary embodiments, I/O Module 305 may be used to output Test Validation Plan 130, such as in a form of a computer-readable medium, as a printed report, as an output in a display or the like.

In some exemplary embodiments, Apparatus 300 may comprise a Memory Unit 307. Memory Unit 307 may be a short-term storage device or long-term storage device. Memory Unit 307 may be a persistent storage or volatile storage. Memory Unit 307 may be a disk drive, a Flash disk, a Random Access Memory (RAM), a memory chip, or the like. In some exemplary embodiments, Memory Unit 307 may retain program code operative to cause Processor 302 to perform acts associated with any of the subcomponents of Apparatus 300. In some exemplary embodiments, Memory Unit 307 may retain program code operative to cause Processor 302 to perform acts associated with any of the steps shown in FIG. 2 above.

In some exemplary embodiments, Memory Unit 307 may retain code, which, when executed by Processor 302, causes Processor 302 to identify for each test of a test plan and with respect to a validation activity, to which equivalence class the test belongs.

In some exemplary embodiments, Memory Unit 307 may retain code, which, when executed by Processor 302, causes Processor 302 to select for each equivalence class a representative test on which to perform the test validation activity. In some exemplary embodiments, a subset of the members of the equivalence class may be selected which may comprise more than one test. In some exemplary embodiments, the selection may be based on an optimization algorithm configured to select a set of tests for all validation activities and from all equivalence classes for which the total costs is deemed minimal.

In some exemplary embodiments, Memory Unit 307 may retain code, which, when executed by Processor 302, causes Processor 302 to display to a user, using UI, the test plan determined by Apparatus 300 and to allow the user to manipulate the test plan such as by selecting a different test on which to perform a test validation activity, to add a duplicate validation activity to be performed, or the like.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of program code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As will be appreciated by one skilled in the art, the disclosed subject matter may be embodied as a system, method or computer program product. Accordingly, the disclosed subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, and the like.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-implemented method, the method performed by a processor, the method comprising:
    receiving a test suite comprising tests, wherein each test of the test suite is associated with at least one functional attribute of a collection of functional attributes;
    receiving a test validation activity, which when given results of performed tests, is operative to be performed to validate the results of two or more of the tests of the test suite, wherein a the test validation activity is performed post-test, and wherein a subset of the collection of functional attributes is deemed as relevant functional attributes with respect to the test validation activity;
    automatically determining, by the processor, a subset of the two or more tests for which to perform the test validation activity, based on valuation of the relevant functional attributes;
    whereby avoiding performing duplicate validation activities after executing all the tests of the test suite; and
    executing the test suite and performing test validations based on said determining, whereby duplicate validation activities for tests that are in an equivalence class are avoided;
    wherein the equivalence class consists of tests having same valuation for the relevant functional attributes.

2. The computer-implemented method of claim 1, further comprises outputting to a user a test validation plan indicating test validation activities to be performed with respect to the test suite.

3. The computer-implemented method of claim 2, further comprising receiving from a user a modification to the test validation plan and displaying the modified test validation plan to the user.

4. The computer-implemented method of claim 1, wherein said determining is performed with respect to a plurality of validation activities, wherein said determining is performed so as to provide a test validation plan that performs all distinct validation activities with respect to the test suite, wherein the test validation plan excludes at least one validation activity from being performed with respect to at least one test of the test suite.

5. The computer-implemented method of claim 4, wherein said determining is performed so as to optimize, using an optimization algorithm, resources required for performing the distinct validation activities.

6. The computer-implemented method of claim 1, further comprising:
   executing all tests of the test suite; and
   in response to said executing, performing the test validation activity for the subset of the two or more tests.

7. A computer-implemented method, the method performed by a processor, the method comprising:
   receiving a test suite comprising tests, wherein each test of the test suite is associated with at least one functional attribute of a collection of functional attributes;
   receiving a test validation activity, which when given results of performed tests, is operative to be performed to validate the results of two or more of the tests of the test suite, wherein a the test validation activity is performed post-test, and wherein a subset of the collection of functional attributes is deemed as relevant functional attributes with respect to the test validation activity;
   automatically determining, by the processor, a subset of the two or more tests for which to perform the test validation activity, based on valuation of the relevant functional attributes;
   whereby avoiding performing duplicate validation activities after executing all the tests of the test suite; and
   executing the test suite and performing test validations based on said determining, whereby duplicate validation activities for tests that are in an equivalence class are avoided;
   wherein the equivalence class comprising tests having one of user-provided alternative valuation for the relevant functional attributes.

8. A computerized apparatus having a processor, the processor being adapted to perform the steps of:
   receiving a test suite comprising tests, wherein each test of the test suite is associated with at least one functional attribute of a collection of functional attributes;
   receiving a test validation activity, which when given results of performed tests, is operative to be performed to validate the results of two or more of the tests of the test suite, wherein a the test validation activity is performed post-test, and wherein a subset of the collection of functional attributes is deemed as relevant functional attributes with respect to the test validation activity;
   automatically determining a subset of the two or more tests for which to perform the test validation activity, based on valuation of the relevant functional attributes;
   whereby avoiding performing duplicate validation activities after executing all the tests of the test suite; and
   executing the test suite and to perform test validations based on said determining, whereby duplicate validation activities for tests that are in an equivalence class are avoided;
   wherein the relevant functional attributes comprise at least two interchangeable functional attributes, and wherein the equivalence class comprises tests having same valuation for the relevant functional attributes in view of the at least two interchangeable functional attributes.

9. The computerized apparatus of claim 8, wherein the processor is further adapted to output to a user a test validation plan indicating test validation activities to be performed with respect to the test suite.

10. The computerized apparatus of claim 9, wherein the processor is further adapted to receive from the user a modification to the test validation plan and displaying the modified test validation plan to the user.

11. The computerized apparatus of claim 8, wherein said determining is performed with respect to a plurality of validation activities, wherein said determining is performed so as to provide a test validation plan that performs all distinct validation activities with respect to the test suite, wherein the test validation plan excludes at least one validation activity from being performed with respect to at least one test of the test suite.

12. The computerized apparatus of claim 11, wherein said determining is performed so as to optimize, using an optimization algorithm, resources required for performing the distinct validation activities.

* * * * *